(12) United States Patent  (10) Patent No.: US 7,429,874 B2
Byun et al.  (45) Date of Patent: Sep. 30, 2008

(54) REPLICA BIAS CIRCUIT

(75) Inventors: Sang Jin Byun, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 227 days.

(21) Appl. No.: 11/451,962

(22) Filed: Jun. 13, 2006

(65) Prior Publication Data
US 2007/0120600 A1 May 31, 2007

(30) Foreign Application Priority Data
Nov. 15, 2005 (KR) .................. 10-2005-0109054

(51) Int. Cl.
*H03K 19/094* (2006.01)
(52) U.S. Cl. ............... 326/81; 326/115; 326/127; 327/156; 327/65; 327/157
(58) Field of Classification Search ............ 326/32, 326/81, 115, 127; 327/210, 201, 208, 156, 327/157, 65
See application file for complete search history.

(56) References Cited

U.S. PATENT DOCUMENTS

| 5,541,532 | A | * | 7/1996 | McCall ............... 326/68 |
| 5,798,658 | A | * | 8/1998 | Werking ............. 326/83 |
| 6,081,162 | A | * | 6/2000 | Johnson ............. 330/301 |
| 6,094,074 | A | * | 7/2000 | Chi et al. ........... 326/115 |
| 6,380,797 | B1 | * | 4/2002 | Macaluso et al. ...... 327/513 |
| 6,937,080 | B2 | | 8/2005 | Hairapetian |

FOREIGN PATENT DOCUMENTS

| JP | 2004096750 | 3/2004 |
| KR | 100358873 | 3/2001 |
| KR | 20030028312 | 4/2003 |

OTHER PUBLICATIONS

'Bust mode clock data recovery circuit of new structure using two phases locked loop conversion technique' Professor Woo-young Choi, Submitted for mater's thesis, Dec. 2003, Graduate School of Electrical and Electronic Engineering, Yonsei University.
'OC-192 Transmitter and Receiver in Standard 0.18-μm CMOS' Cao et al., IEEE Journal of Solid-State Circuits, vol. 37, No. 12, Dec. 2002, pp. 1768-1780.

* cited by examiner

*Primary Examiner*—Vibol Tan
(74) *Attorney, Agent, or Firm*—Ladas & Parry LLP

(57) ABSTRACT

Provided is a replica bias circuit which is suitable for multi-layer stacked CMOS current mode logic (CML) and is stably used in application fields using a low power supply voltage. The replica bias circuit applies a reference voltage to gates of target transistors constituting an electronic circuit. The replica bias circuit includes a sub threshold voltage generator for maintaining a voltage difference lower than a threshold voltage of the transistor; and a replica path including devices designed by referring to dimensions of constituent devices forming a current flow path, the current flow path including the target transistors in the electronic circuit. With the replica bias circuit, multi-layer stacked CMOS current mode logic (CML) circuits can stably operate even at a low power supply voltage.

14 Claims, 4 Drawing Sheets

REPLICA BIAS CIRCUIT

CROSS-REFERENCE TO RELATED APPLICATION

This application claims priority to and the benefit of Korean Patent Application No. 2005-0109054, filed Nov. 15, 2005, the disclosure of which is incorporated herein by reference in its entirety.

REFERENCES (1) KR Patent No. 358873, entitled "Latch Circuit and Register Circuit"
(2) U.S. Pat. No. 6,937,080, entitled "Current-controlled CMOS Logic Family"

BACKGROUND

1. Field of the Invention

The present invention relates to a bias circuit for supplying a constant voltage, and more particularly, to a new replica bias circuit which has a generator for generating a sub threshold voltage lower than a threshold voltage of a transistor, and which can be used in application fields using a low power supply voltage. For example, the present invention relates to a replica bias circuit for supplying a bias voltage to three-layer stacked CMOS current mode logic (CML) gates and latches that are widely used in integrated circuit devices.

2. Discussion of Related Art

Typical CMOS logic circuits include CMOS switches and CMOS inverters (See the above KR Patent). Such CMOS logic circuits exhibit a stable operation characteristic and have no static current, but operate at a low speed. For high-speed operation, CMOS current mode logic (CML) is used (See the above US patent). The CMOS current mode logic may have a two-layer stacked structure like an inverter or a buffer, or a three-layer stacked structure like a latch or an AND circuit. In the three-layer stacked CMOS current mode logic, when a bias voltage is supplied using a level shifter 120 according to the above US patent as shown in FIG. 1, a difference between a power supply voltage and a ground voltage should be sufficient (e.g., 1.8 V or greater) to guarantee stable operation. Otherwise, the logic becomes sensitive to PVT (process, voltage, temperature) variation.

However, the recent development of a CMOS process lowers a line width to 0.13 μm or less and a power supply voltage to 1.2 V or less. Use of the three-layer stacked CMOS current mode logic, even at a low power supply voltage, requires a suitable replica bias circuit.

SUMMARY

The present invention is directed to implementation of a replica bias circuit capable of supplying a bias voltage that is stable even under conditions of PVT (process, voltage, temperature) variation.

The present invention is also directed to implementation of a replica bias circuit capable of supplying a stable bias voltage even when a difference between a power supply voltage and a ground voltage is small.

The present invention is also directed to implementation of a replica bias circuit allowing high-speed multi-layer stacked CMOS current mode logic (CML) to be stably used even at a low power supply voltage.

One aspect of the present invention provides a replica bias circuit for applying a reference voltage to gates of target transistors constituting an electronic circuit, the replica bias circuit including: a sub threshold voltage generator for maintaining a voltage difference lower than a threshold voltage of the transistor; and a replica path including devices designed by referring to dimensions of constituent devices forming a current flow path, the current flow path including the target transistors in the electronic circuit.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Hereinafter, an exemplary embodiment of the present invention will be described in detail. However, the present invention is not limited to the exemplary embodiment disclosed below, but can be implemented in various modified forms. The present exemplary embodiment is provided for a complete disclosure of the present invention that is fully enabling to those of ordinary skill in the art.

First Exemplary Embodiment

Figure 2:
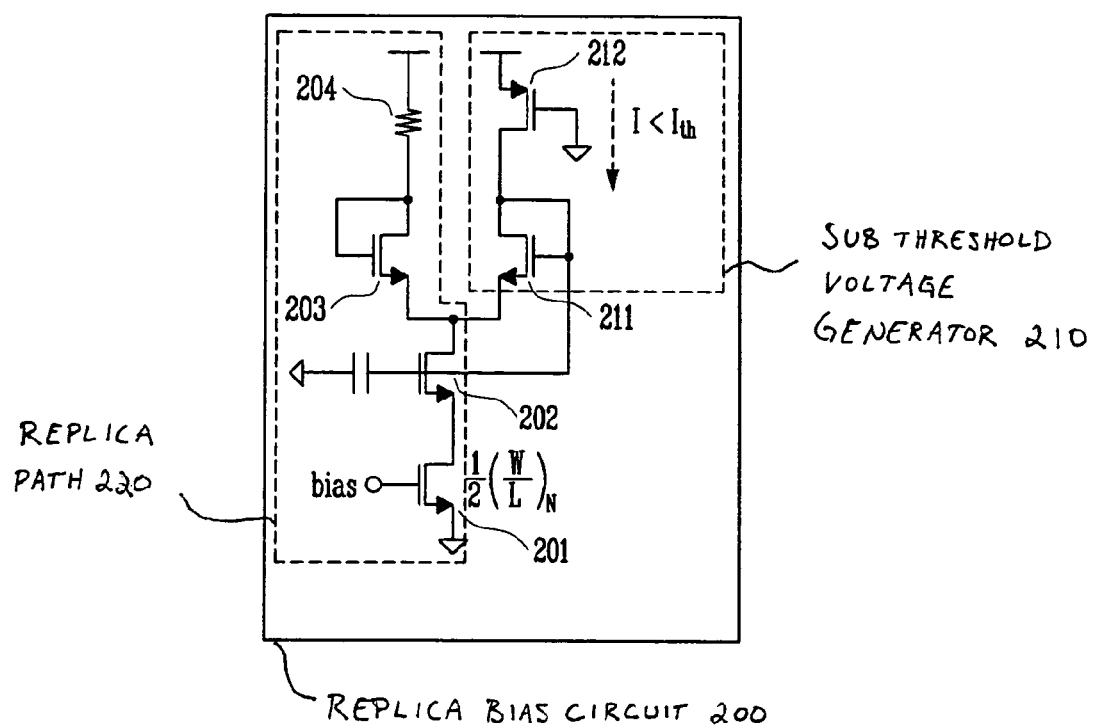
FIG. 2 is a circuit diagram illustrating a replica bias circuit having a sub threshold voltage generator according to an exemplary embodiment of the present invention.
Figure 3:
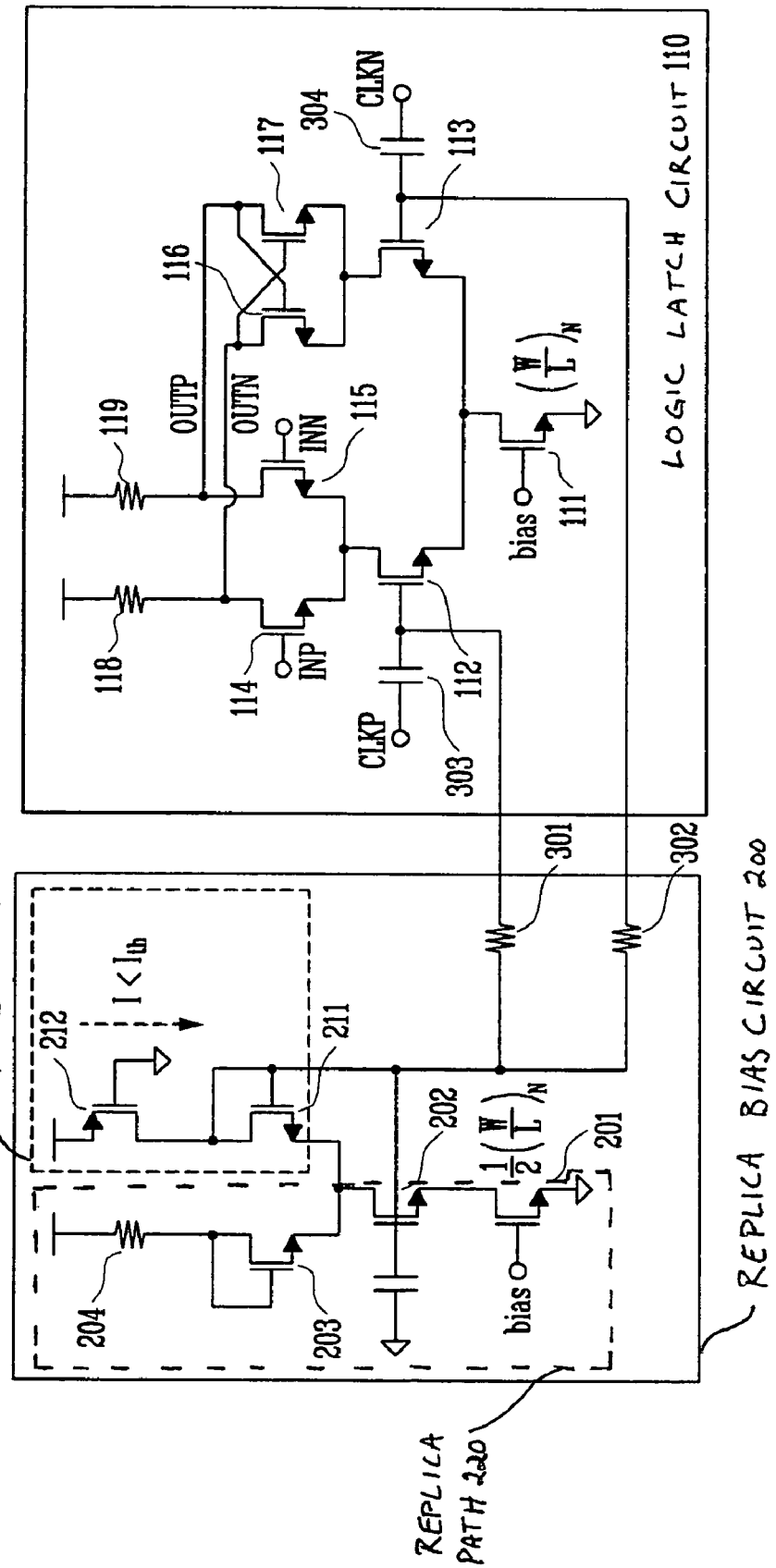
FIG. 3 is a circuit diagram illustrating a three-layer stacked CMOS current mode logic latch circuit having the replica bias circuit of FIG. 2.

FIG. 2 is a circuit diagram illustrating a replica bias circuit 200 according to an exemplary embodiment of the present invention, and FIG. 3 is a circuit diagram illustrating a three-layer stacked CMOS current mode logic (CML) latch circuit 110 having the replica bias circuit 200 of FIG. 2.

In FIG. 3, the three-layer stacked CMOS current mode logic latch circuit 110 is a main circuit that is supplied with a bias voltage generated by the replica bias circuit 200 according to an exemplary embodiment of the present invention. In the three-layer stacked CMOS current mode logic latch circuit 110, transistors 112 and 113 are target devices directly supplied with the bias voltage.

Referring to FIG. 3, the replica bias circuit includes transistors 201, 202 and 203 and a resistor 204 designed by referring to W/L of specific transistors 111, 112, 113, 114, 115, 116 and 117 or resistances of resistors 118 and 119 in the three-layer stacked CMOS current mode logic latch circuit 110, which is supplied with the bias voltage; and a sub threshold voltage generator 210. In FIG. 3, AC coupling capacitors 303 and 304 and resistors 301 and 302 are added between the replica bias circuit 200 and the three-layer stacked current mode logic latch 110 so that the replica bias circuit 200 gives a bias voltage through resistors 301 and 302.

In the shown structure, the transistor 201 corresponds to the transistor 111, the transistor 202 corresponds to the transistor 112, the transistor 203 corresponds to the transistors 114 and 115, and the resistor 204 corresponds to the resistor 118. Here, "designed by referring to" means the use of the relationship indicated by the following equation:

$$W/L \text{ of transistor } 201 : W/L \text{ of transistor } 202 : W/L \text{ of transistor } 203 : \text{resistor } 204 = (\tfrac{1}{2}) W/L \text{ of transistor } 111 : W/L \text{ of transistor } 112 : W/L \text{ of transistor } 114 + W/L \text{ of transistor } 115 : \text{resistor } 118 \quad \text{Equation 1}$$

If "designed by referring to," a ratio of dimensions (W/L and resistances) of the devices forming a replica path 220 is the same as a ratio of dimension of devices forming a corresponding path in the main circuit supplied with the bias voltage. To this end, the dimensions of the devices forming the replica path 220 are equal to the dimensions of the corresponding devices of the main circuit multiplied by the same real number n.

For example, if n is 1, the W/L of the transistor 201 is equal to one half of the W/L of the transistor 111. The W/L of the transistor 202 is equal to the W/L of the transistor 112. The W/L of the transistor 203 is equal to the sum of the W/L of the transistor 114 and the W/L of the transistor 115.

Figure 1:
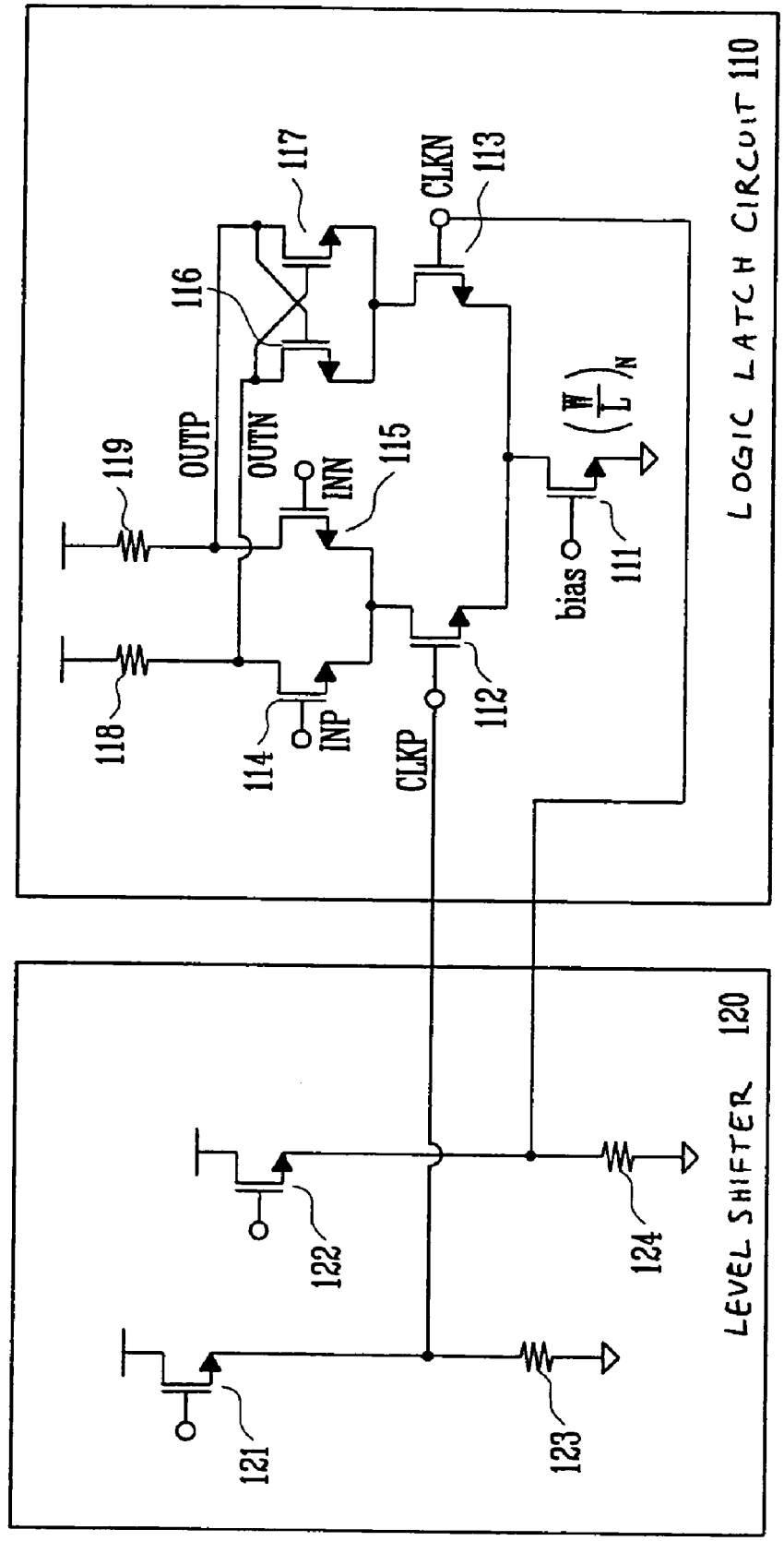
FIG. 1 is a circuit diagram illustrating a conventional bias circuit connected to a three-layer stacked CMOS current mode logic (CML) latch circuit.

The transistor 201 corresponds to one half of the transistor 111. This is because, in the three-layer stacked CMOS current mode logic latch circuit of FIG. 3, current passing through the transistor 112 and current passing through the transistor 113 simultaneously flow into a channel of the transistor 111, and the current passing through the transistor 112 and the current passing through the transistor 113 are substantially the same such that the transistor 111 is regarded as being included only by ½ in the current path including the transistor 112. Further, the resistance of the resistor 204 is equal to the resistance of the resistor 118. The bias circuit 200 of FIG. 2 having such relationships has a replica relationship with the three-layer stacked current mode logic latch 110 of FIG. 1.

Other dimensions associated with the channel characteristic of the transistor may have the above-described relationships. W/L is sensitive to PVT and is significantly affected by transistor channel performance. Thus, W/L is preferably considered in a designing process.

Meanwhile, the sub threshold voltage generator 210 includes a low voltage transistor 211 and a sub threshold current forcer for allowing smaller current relative to a channel dimension of the low voltage transistor to flow into the low voltage transistor. The sub threshold current forcer is connected in series with the low voltage transistor 211 and is implemented by a small current transistor 212 having a smaller channel dimension (W/L) than the low voltage transistor 211.

That is, the sub threshold voltage generator 210 for maintaining the voltage difference smaller than the threshold voltage of a typical transistor may be implemented by the two transistors 211 and 212 having a very different dimension (W/L). The transistor 211 may have the same W/L as the transistor 202. The transistor 212 has a much smaller W/L than the transistor 211. Designing the transistor 212 to have a very small W/L can make the current flowing through the channel of the transistor 211 smaller than the threshold current of the transistor 211 and eventually make the Vgs (gate-source voltage) of the transistor 211 smaller than the threshold voltage. The connection of the transistors in the replica bias circuit 200 as in FIG. 2 makes a Vgd (gate-drain voltage) of the transistor 202 identical to Vgs of the transistor 211. Thus, Vgs of the transistor 211 and Vgd of the transistor 202 become smaller than the threshold voltage, and the transistor 202 always operates stably in a saturation area.

In this case, there is a high possibility that the transistor 202 operating in the saturation area as described above becomes sensitive to PVT. However, since the transistor 202 forms the replica path 220 of the devices having the same dimension ratio as the current flow path of the main circuit that is supplied with the bias voltage, a characteristic change of the transistor 202 due to the PVT variation is cancelled by a characteristic change of the main circuit due to the same PVT variation when the replica path and the main circuit are formed in the same process.

In this manner, it is possible to guarantee stable operation at a low power supply voltage without having to increase the gate voltage of the transistor 202.

Second Exemplary Embodiment

Figure 4:
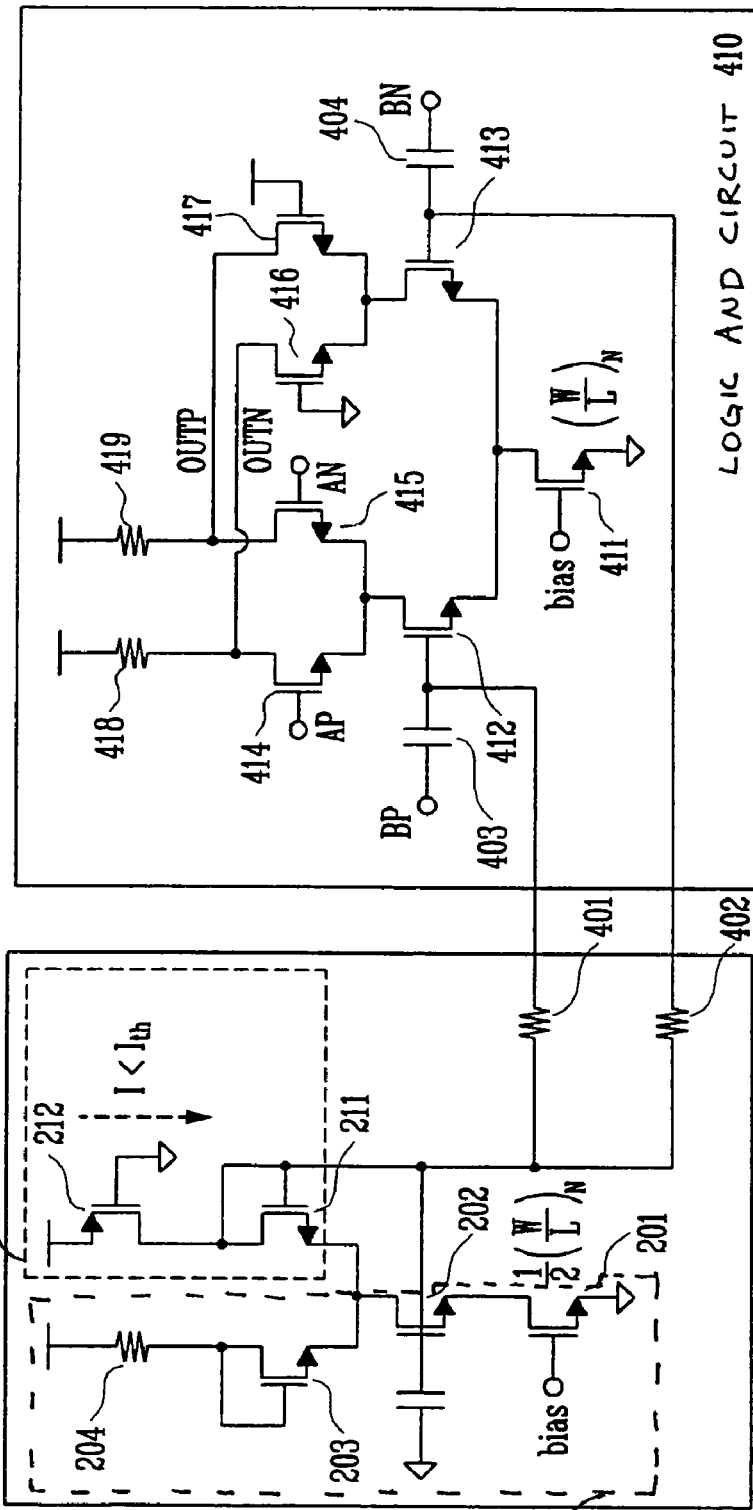
FIG. 4 is a circuit diagram illustrating a three-layer stacked CMOS current mode logic AND circuit having the replica bias circuit of FIG. 2.

FIG. 4 is a circuit diagram illustrating a three-layer stacked CMOS current mode logic AND circuit 410 having the replica bias circuit 200 that includes the sub threshold voltage generator 210 of FIG. 2. AC coupling capacitors 403 and 404 and resistors 401 and 402 are added between the replica bias circuit 200 and the three-layer stacked current mode logic AND circuit 410 so that the replica bias circuit 200 gives a bias voltage through resistors 401 and 402.

In FIG. 4, the three-layer stacked CMOS current mode logic AND circuit 410 is a main circuit that is supplied with a bias voltage generated by the replica bias circuit 200 according to an exemplary embodiment of the present invention. In the three-layer stacked CMOS current mode logic AND circuit 410, transistors 412 and 413 are target devices directly supplied with the bias voltage.

As the three-layer stacked CMOS current mode logic AND circuit is used instead of the three-layer stacked CMOS current mode logic latch circuit, there is a difference between the connection structure of the transistors 116 and 117 and the connection structure of transistors 416 and 417. However, since this difference is irrelevant to implementation of the present invention and other portions are substantially the same as in the first exemplary embodiment, a detailed description of the connection structure will be omitted.

With the replica bias circuit according to the present invention as described above, the multi-layer stacked CMOS current mode logic (CML) circuit can stably operate even at a low power supply voltage.

Further, the replica bias circuit can supply a stable bias voltage even when PVT (process, voltage and temperature) conditions change.

Further, the replica bias circuit can supply a stable bias voltage even when a difference between the power supply voltage and a ground voltage is small.

Furthermore, the replica bias circuit allows high-speed multi-layer stacked CMOS current mode logic to be stably used even at a low power supply voltage.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A replica bias circuit for applying a reference voltage to gates of target transistors constituting an electronic circuit, the replica bias circuit comprising:
   a sub threshold voltage generator comprising:
      a low voltage transistor; and
      a sub threshold current forcer allowing smaller current relative to a channel dimension of the low voltage transistor to flow into the low voltage transistor, wherein the sub threshold voltage generator maintains a sub threshold voltage lower than a threshold voltage of the low voltage transistor; and a replica path including devices designed by referring to dimensions of constituent devices forming a current flow path, the current flow path including the target transistors in the electronic circuit.

2. The replica bias circuit according to claim 1, wherein each constituent device on the replica path has a correspondence relationship with each constituent device on the current flow path.

3. The replica bias circuit according to claim 1, wherein the constituent device on the replica path and the constituent device on the current flow path are manufactured through the same manufacturing process.

4. The replica bias circuit according to claim 1, wherein the sub threshold current forcer, which is connected in series with the low voltage transistor, is comprised of a small current transistor having a channel dimension smaller than that of the low voltage transistor.

5. The replica bias circuit according to claim 1, wherein the replica path comprises at least one transistor for providing a current flow channel, and the sub threshold voltage generator forces at least one of the transistors forming the replica path to operate in a saturation area.

6. The replica bias circuit according to claim 1, wherein the electronic circuit is a CMOS logic latch circuit having a multi-layer stacked current mode structure.

7. The replica bias circuit according to claim 1, wherein the electronic circuit is a CMOS logic circuit having a multi-layer stacked current mode structure.

8. A replica bias circuit for applying a reference voltage to gates of target transistors constituting an electronic circuit, the replica bias circuit comprising:

a sub threshold voltage generator maintaining a sub threshold voltage lower than a threshold voltage of the low voltage transistor; and a replica path including devices designed by referring to dimensions of constituent devices forming a current flow path, the current flow path including the target transistors in the electronic circuit, wherein the replica path comprises at least one transistor providing a current flow channel, and the sub threshold voltage generator forces at least one of the transistors forming the replica path to operate in a saturation area.

9. The replica bias circuit according to claim 8, wherein each constituent device on the replica path has a correspondence relationship with each constituent device on the current flow path.

10. The replica bias circuit according to claim 8, wherein the constituent device on the replica path and the constituent device on the current flow path are manufactured through the same manufacturing process.

11. The replica bias circuit according to claim 8, wherein the sub threshold voltage generator comprises:

a low voltage transistor; and a sub threshold current forcer for allowing smaller current relative to a channel dimension of the low voltage transistor to flow into the low voltage transistor.

12. The replica bias circuit according to claim 11, wherein the sub threshold current forcer, which is connected in series with the low voltage transistor, is comprised of a small current transistor having a channel dimension smaller than that of the low voltage transistor.

13. The replica bias circuit according to claim 8, wherein the electronic circuit is a CMOS logic latch circuit having a multi-layer stacked current mode structure.

14. The replica bias circuit according to claim 8, wherein the electronic circuit is a CMOS logic circuit having a multi-layer stacked current mode structure.

* * * * *